United States Patent [19]

Nakaso et al.

[11] Patent Number: 4,902,551

[45] Date of Patent: Feb. 20, 1990

[54] PROCESS FOR TREATING COPPER SURFACE

[75] Inventors: Akishi Nakaso, Oyama; Toshiro Okamura; Haruo Ogino, both of Shimodate; Tomoko Watanabe, Ibaraki; Yuko Kimura, Shimodate, all of Japan

[73] Assignee: Hitachi Chemical Company, Ltd., Tokyo, Japan

[21] Appl. No.: 224,911

[22] Filed: Jul. 27, 1988

[30] Foreign Application Priority Data

Dec. 14, 1987 [JP] Japan ................................. 62-315750

[51] Int. Cl.4 ............................ B32B 3/10; B44C 1/22
[52] U.S. Cl. ...................................... 428/137; 29/852; 148/269; 148/272; 156/151; 156/253; 156/281; 156/314; 156/630; 156/902; 204/27; 204/38.1; 428/901
[58] Field of Search ............... 156/151, 314, 253, 630, 156/281, 902; 148/6.14 R, 269, 272; 204/27, 38.1; 428/137, 901; 29/852

[56] References Cited

U.S. PATENT DOCUMENTS

| | | | |
|---|---|---|---|
| 3,198,672 | 8/1965 | Fehart | 148/6.14 R |
| 3,551,304 | 12/1970 | Letter et al. | 204/38.1 |
| 4,020,225 | 4/1977 | Fujiwara . | |
| 4,409,037 | 10/1983 | Landau . | |
| 4,642,161 | 2/1987 | Akahoshi et al. | 156/314 |

FOREIGN PATENT DOCUMENTS 0249425 12/1987 European Pat. Off. .

*Primary Examiner*—John J. Gallagher
*Attorney, Agent, or Firm*—Antonelli, Terry & Wands

[57] ABSTRACT

Adhesion of copper to a resin layer is improved by reducing a copper oxide layer with an aqueous aldehyde solution (a) while applying a potential of −1000 mV to −400 mV to the copper oxide layer, (b) after contacting with a metal piece made of copper or a metal nobler than copper, or (c) after contacting with an aqueous solution of alkali borohydride.

14 Claims, No Drawings

PROCESS FOR TREATING COPPER SURFACE

BACKGROUND OF THE INVENTION

This invention relates to a process for treating a copper surface suitable for making copper on an internal layer circuit board adhere to a prepreg in a step for laminating internal layer circuit boards and prepregs alternately for producing a multi-layer printed wiring board.

Multi-layer printed circuit boards have been produced by removing unnecessary portions of copper foils of upper-clad laminates by, for example, etching to form internal layer circuits, roughening the copper surfaces of internal layer circuits with a chemical fluid, subjecting the roughened surfaces to oxidation treatment, piling prepregs and copper foils which become outer layer circuits on a plurality of internal layer circuit boards and laminating them into one body, drilling holes at portions necessary for connecting the outer layer circuits and the internal layer circuits, removing resins and pieces of glass sticked to surfaces of the holes with a chemical treating fluid, forming a metal layer such as a copper layer by electroless plating or the like, and forming outer layer circuits by etching or the like. In such a process, the oxidation treated layer of copper surface exposed on the surfaces of holes is easily corroded by the acidic chemical treating fluid in a later step to form portions wherein no adhesion is maintained between the internal layer copper foils and prepregs around the holes (so-called pink rings), which results in bringing about peeling by a thermal shock such as soldering.

In order to form a surface hardly dissolved with the chemical treating fluid which is more acidic than copper oxide, Japanese Patent Unexamined Publication No. 56-153797 discloses a process wherein the copper oxide formed is reduced by dipping in an alkali solution such as a solution of sodium borohydride, formaldehyde or the like. But when copper oxide is reduced by using a sodium borohydride solution, the surface appearance is blurred after the treatment and adhesion of prepregs often becomes insufficient. On the other hand, when an aqueous solution of formaldehyde is used, there takes place a problem that the treating rate is small.

On the other hand, in order to improve adhesion between a metal and a resin in the production of multi-layer printed wiring boards, there are proposed the use of an amineboran as a reducing agent for copper oxide (Japanese Patent Unexamined Publication No. 61-176192), the treatment of copper oxide with an activating solution including a catalytic metal element before the reduction to copper (Japanese Patent Unexamined Publication No. 61-279531), the use of a reducing agent solution dispersing metal particles having a catalytic ability therein (Japanese Patent Unexamined Publication No. 61-266228), and the exposure of metallic copper on a part of a copper surface covered with a copper oxide layer when the copper oxide layer is reduced with a reducing agent solution (Japanese Patent Unexamined Publication No. 61-250036). But the adhesive strength between the metal (copper) and the resin is still insufficient for practical use according to these proposals.

SUMMARY OF THE INVENTION

It is an object of this invention to provide a process for treating a copper surface, particularly in the production of multi-layer printed wiring boards, overcoming disadvantages of the prior art techniques and giving strong adhesive strength between a copper layer and a resin layer with a fast treating speed.

This invention provides a process for treating a copper surface which comprises forming a copper oxide layer on a copper surface by treating with an aqueous solution containing an oxidizing agent, and treating the copper oxide layer with an aqueous aldehyde solution having a pH of 9.0 or higher to reduce the copper oxide, said treatment of the copper oxide layer being carried out (a) while applying a potential of $-1000$ mV to $-400$ mV in terms of Ag-AgCl electrode to the copper oxide layer, (b) after contacting the copper oxide layer with a contacting piece made of copper or a metal nobler than copper, or (c) after contacting the copper oxide layer with an aqueous solution containing an alkali borohydride so as to make the potential of copper surface in the range of -1000 mV to -400 mV in terms of Ag-AgCl electrode.

DESCRIPTION OF THE PREFERRED EMBODIMENTS

A copper oxide layer in fine relief is first formed on a copper surface by treating with an aqueous solution containing an oxidizing agent.

As the oxidizing agent, there can be used sodium chlorite, potassium persulfate, potassium chlorate, potassium perchlorate, etc.

The treatment can be carried out by dipping, spraying, or the like.

A typical example of the copper oxide treating aqueous solution is as follows:

| | | |
|---|---|---|
| $NaClO_2$ | 5–150 | g/l |
| $NaPO_4.12H_2O$ | 10–60 | g/l |
| NaOH | 1–50 | g/l |

Preferable treating conditions are to use the treating aqueous solution at temperature of 55° to 95° C. with a contact time of 15 seconds or more.

The treating aqueous solution may further contain one or more $OH^-$ ion sources and/or one or more buffering agents such as trisodium phosphate, etc.

It is preferable to conduct a pretreatment of the copper surface before forming a copper oxide layer by contacting the copper surface with an aqueous solution of ammonium persulfate or cupric chloride and hydrochloric acid for roughening the copper surface after degreasing.

After the formation of the copper oxide layer, reduction of the copper oxide layer is carried out by treating with an aqueous aldehyde solution having a pH of 9.0 or higher combined with one of the following three treatments:

(a) while applying a potential of $-1000$ mV to $-400$ mV in terms of Ag-AgCl electrode (i.e. when measured by using an Ag-AgCl electrode) to the copper oxide layer, (b) after contacting the copper oxide layer with a contacting piece made of copper or a metal nobler than copper, and (c) after contacting the copper oxide layer with an aqueous solution containing an alkali borohydride so as to make the potential of copper surface in the range of −1000 mV to −400 mV in terms of Ag-AgCl electrode.

According to the method (a), the reduction of copper oxide layer is carried out as follows.

The copper oxide layer in fine relief is reduced to metallic copper by treating with an aqueous aldehyde solution, while applying a potential of −1000 mV to −400 mV in terms of Ag-AgCl electrode to the copper oxide layer, at least for a while. As the aldehyde, there can be used formaldehyde, paraformaldehyde, an aromatic aldehyde such as benzaldehyde. The pH of the aldehyde aqueous solution is 9.0 or higher, preferably 10.5 or higher. The higher the pH becomes, the stronger the reducing power becomes. As a pH adjusting agent, there can be used an alkali hydroxide such as NaOH.

The adding amount of the aqueous aldehyde solution is preferably 0.01 mole/l or more, more preferably 0.02 mole/l or more. Too high concentration is not preferable due to worsening of working circumstances.

The temperature of the aqueous aldehyde solution is not limited so long as maintaining the aqueous solution. Generally speaking, since the activity is lowered with lowering of the solution temperature, it is necessary to enhance the concentration of the aldehyde solution.

The potential of the copper oxide layer in the aqueous aldehyde solution is about −150±100 mV in terms of Ag-AgCl electrode. But such a high voltage is not preferable to start the reducing reaction rapidly. In contrast, by applying a potential of −1000 mV to −400 mV in terms of Ag-AgCl electrode to the copper oxide layer at least for a while, for example, even 1 second or less, the reducing reaction can be started remarkably fast. The potential of −1000 mV to −500 mV is more preferable. In order to maintain the potential at such a low value, the copper oxide layer may be contacted with copper or a noble metal such as platinum, palladium, or the like in the aqueous aldehyde solution. The potential of −400 mV or lower can also be obtained by using a constant potential source. In this case, the object is to supply the potential, and thus a small current may be applicable.

The time necessary for treating with the aqueous aldehyde solution is that necessary for making the potential of treating surface −400 mV, or lower preferably −500 mV or lower, in the aqueous aldehyde solution in terms of Ag-AgCl electrode, except for the operation for maintaining at the lower potential state. Usually, the period of 120 seconds or more is necessary.

The metallic copper has a potential of about −800±200 mV in terms of Ag-AgCl electrode in the aqueous aldehyde solution. Therefore, when the potential is lower than −500 mV, at least a part of copper oxide can be reduced.

According to the method (b), the reduction of copper oxide layer is carried out as follows.

After contacting the copper oxide layer with a contacting piece made of copper or a metal nobler than copper, the copper oxide layer is reduced to metallic copper by treating with an aqueous aldehyde solution having a pH of 9.0 or higher.

As to the contacting piece, it is sufficient that the surface portion of contacting piece is made of copper or a metal nobler than copper. Examples of the metal nobler than copper are gold, platinum, palladium, and the like. The contacting piece can preferably take a form of a roll. One example of such a roll is a rubber roll, the surface of which is covered with a cloth plated with a metal as mentioned above. A copper plated cloth manufactured by Seren K.K. is available commercially. It is more preferable to use a cloth plated with a noble metal such as gold, palladium, or the like in addition to copper plating.

It is also possible to use a rod capable of conducting surface contact to some extent, a brush, or a cloth, in place of the roll.

It is sufficient that the contacting piece relatively move on the copper oxide layer. That is, either one of the contacting piece or the copper oxide layer can be moved, or both of them can be moved. For example, a substrate having the copper oxide layer thereon is moved by one or more rolls. It is preferable to slide the contacting piece and the copper oxide layer while keeping point or surface contact such as contacting a freely movable roll with the moving substrate. In order to speed up the contacting process, it is preferable to use a plurality of pairs of rolls facing each other in series. In the case of using a cloth as the contacting piece, it is possible to move the cloth and the copper oxide layer while surface contacting them to some extent and sliding. It is also possible to reduce copper oxide by treating with the aqueous aldehyde solution having a pH of 9 or higher, while relatively moving the copper oxide layer and the contacting piece and keeping point or surface contacting of the two. The treatment with the aqueous aldehyde solution can be carried out by dipping, spraying and the like.

As the aldehyde, there can be used formaldehyde, paraformaldehyde, an aromatic aldehyde such as benzaldelhyde. The pH of the aldehyde aqueous solution is 9.0 or higher, preferably 10.5 or higher. The higher the pH becomes, the stronger the reducing power becomes. As a pH adjusting agent, there can be used an alkali hydroxide such as NaOH.

The adding amount of the aldehyde aqueous solution is preferably 0.01 mole/l or more, more preferably 0.02 mole/l or more. Too high concentration is not preferable due to worsening of working circumstances.

The copper oxide formed on the copper surface has fine concaves and convexes with several microns. By the effect of such shapes, the adhesive strength to a prepreg resin layer to be laminated can be improved.

Further, since the aqueous aldehyde solution having a pH of 9.0 or higher has a reducing power, copper oxide is reduced in contact with the aqueous aldehyde solution. Further, since fine relief shape can be retained after the reduction, the adhesive strength to the resin layer to be laminated can be improved, and the adhesion interface is made resistant to an acidic solution and an electroless copper plating bath.

By contacting the copper oxide layer with the contacting piece, the reduction of copper oxide takes place rapidly when contacted with the aqueous aldehyde solution having a pH of 9.0 or higher. Thus, the time necessary for reducing copper oxide is shortened remarkably and can be within several minutes for completing the reduction.

When one or more rolls are used as the contacting piece, the reducing treatment of copper oxide can be carried out continuously. Recently, wiring of copper conductor on a printed wiring board has independent portions and miniaturized, but uniform contact becomes possible by using a roll as the contacting piece.

According to the method (c) the reduction of copper oxide layer is carried out as follows.

After contacting the copper oxide layer with an aqueous solution containing an alkali borohydride so as to make the potential of copper surface in the range of −1000 mV to −400 mV in terms of Ag-AgCl electrode, the copper oxide layer is reduced to metallic copper by treating with an aqueous aldehyde solution having a pH of 9.0 or higher.

As the alkali borohydride which is used as a reducing agent, there can be used sodium borohydride, potassium borohydride, etc. The concentration of alkali borohydride influences a changing rate of the potential of copper surface subjected to oxidation treatment and uniformity of surface appearance after the reduction. The concentration of alkali borohydride is preferably 0.1 g/l or more, more preferably 0.2 to 5 g/l. Since the alkali borohydride is easily decomposed naturally, it is preferable to add lead acetate, lead chloride, lead sulfate, or thioglycolic acid in order to prevent the decomposition. The decomposition can also be prevented by making the pH 10 to 13.

The contact time between the copper surface subjected to oxidation treatment and the alkali borohydride is extremely important. When the oxidation treated copper surface is contacted with the alkali borohydride, copper oxide begins its reduction. The potential of oxidation treated copper surface changes to a lower side. In this case, when the contact time is prolonged until the potential becomes lower than −1000 mV, non-uniformity of surface appearance often takes place to stop the improvement of adhesive strength. In order to prevent such a problem, the potential of −1000 mV to −400 mV should be maintained. In practice, it is not necessary to watch the potential always. Preferable contact time can be determined by the composition and temperature of the aqueous alkali borohydride solution. For example, in the case of sodium borohydride with a concentration of 1 g/l, pH 12.5, and a temperature of 40° C., a preferable contact time is 3 to 180 seconds.

As the aqueous aldehyde solution, the same one as used in the method (b) mentioned above can also be used.

When the copper surface subjected to the treatment with the aqueous alkali borohydride solution is contacted with the aqueous aldehyde solution, the initial potential of copper is in the range of −1000 mV to −400 mV in terms of Ag-AgCl electrode. When the contact is continued, the potential is changed to be lower than −1000 mV which is the potential of metallic copper. The time necessary for contacting with the aqueous aldehyde solution is one until the potential of copper becomes not lower than −1000 mV. In practice, the contact time is changed depending on the composition, concentration, and temperature of the aqueous aldehyde solution. For example, when a 36% formaldehyde aqueous solution with a concentration of 4 ml/l, pH 2.5 and a temperature of 50° C. is used, preferable contact time is 180 seconds.

The copper surface subjected to the aqueous alkali borohydride solution treatment can directly be contacted with the aqueous aldehyde solution, or washed with water, followed by contact with the aqueous aldehyde solution.

The copper surface treatment of this invention can be applied to not only the pretreatment of internal circuits to be subjected to multi-layer adhesion, but also circuit surface treatment before the formation of a resist on a printed circuit board, or copper surface treatment before adhesion of a flexible substrate and copper foils in order to improve the adhesive strength between the copper foil and a resin layer.

A multi-layer printed wiring board can be produced by piling a plurality of the thus treated wiring boards having been formed internal layer circuits and a plurality of prepregs obtained by impregnating a substrate such as paper, glass cloth, etc., with a thermosetting resin and drying, alternately, followed by pressing with heating, by a conventional method.

This invention can be applied to the production of multi-layer printed wiring boards obtained by adhering internal layer wiring boards to prepregs; laminates of copper-clad laminates, wiring boards having conductor circuits thereon and solder resists; copper-clad laminates obtained by laminating copper foils and prepregs; substrates for flexible wiring boards obtained by laminating copper foils and flexible films, etc.

More concretely, the present invention can be applied to the following embodiments.

A copper-clad laminate can be obtained by subjecting one or two surfaces of copper foil to the surface treatment process of this invention; laminating one or more surface treated copper foils and one or more sheets of glass cloth or paper impregnated with an epoxy resin, a phenol resin or a polyimide resin or one or more sheets of an epoxy resin, a phenol resin or a polyimide resin mixed with glass fibers, or laminating one or more the thus surface treated copper foils coated with an epoxy resin, a phenol resin or a polyimide resin; and subjecting to heating and pressing treatment to form a laminated unit having copper layers on the outermost surfaces.

A copper-clad flexible film can be obtained by subjecting one or both surfaces of copper foil to the surface treatment process of this invention; and bonding a flexible resin film to the resulting copper foil using an adhesive of epoxy resin or acrylic resin so as to have copper layers on the outermost surfaces, wherein the flexible resin film is made from polyimide, polyester, polytetrafluoroethylene, polysulfone, or polyether ether ketone.

A multi-layer wiring board can be obtained by laminating one or more copper foils and one or more sheets of glass cloth or paper impregnated with an epoxy resin, a phenol resin or a polyimide resin or one or more sheets of an epoxy resin, a phenol resin or a polyimide resin mixed with glass fibers, or laminating one or more copper foils coated with an epoxy resin, a phenol resin or a polyimide resin; subjecting to heating and pressing treatment to form a copper-clad laminate; removing unnecessary portions from the copper foil of the laminate by etching to form a circuit pattern for an internal layer; subjecting the copper foil thus treated to the surface treatment process of this invention; laminating on the resulting copper surface an epoxy resin, a phenol resin or a polyimide resin, or a glass cloth or paper impregnated with an epoxy resin, a phenol resin or a polyimide resin, or laminating a sheet of an epoxy resin, a phenol resin or a polyimide resin mixed with glass fibers, with repetition of laminating to form a multiple layers and a copper foil as an outermost layer; subjecting to heating and pressing treatment to form a laminated unit having copper layers on the outermost surfaces; drilling through-holes in the laminated unit; metallizing inner walls of the through-holes; and removing unnecessary portions from the outermost copper layers by etching to form circuits.

A multi-layer wiring board can also be obtained by laminating one or more copper foils and one or more sheets of glass cloth or paper impregnated with an epoxy resin, a phenol resin or a polyimide resin or one or more sheets of an epoxy resin, a phenol resin or a polyimide resin mixed with glass fibers, or laminating one or more copper foils coated with an epoxy resin, a phenol resin or a polyimide resin; subjecting to heating and pressing treatment to form a copper-clad laminate; removing unnecessary portions from the copper foil of the laminate by etching to form a circuit pattern for an internal layer; subjecting the copper foil thus treated to the surface treatment process of this invention; laminating on the resulting copper surface an epoxy resin, a phenol resin or a polyimide resin, or a glass cloth or paper impregnated with an epoxy resin, a phenol resin or a polyimide resin, or laminating a sheet of an epoxy resin, a phenol resin or a polyimide resin mixing with glass fibers, with repetition of laminating to form a multiple layers and a copper foil subjected to the surface treatment process of this invention as an outermost layer; subjecting to heating and pressing treatment to form a laminated unit having copper layers on the outermost surfaces; drilling through-holes in the laminated unit; metallizing inner walls of the through-holes; and removing unnecessary portions from the outermost copper layers by etching to form circuits.

Further, a flexible wiring board can be obtained by bonding a copper foil to a flexible resin film using an adhesive of epoxy resin or acrylic resin to form a copper-clad flexible film; removing unnecessary portions from the copper foil by etching to form a circuit pattern for an inner layer; subjecting the copper foil thus treated to the surface treatment process of this invention; and bonding a flexible resin film from which unnecessary portions for connection are removed to the thus treated copper surface with an adhesive of epoxy resin or acrylic resin, wherein the flexible resin film is made from polyimide, polyester, polytetrafluoroethylene, polysulfone, or polyether ether ketone.

The resin layers can be used in the form of a prepreg, film, curtain coat, etc. As the resin, there can be used thermosetting resins such as phenol resins, epoxy resins, polyesters, polyimides, etc.; thermoplastic resins such as polytetrafluoroethylene, polysulfones, polyether sulfones, polyetherimides, etc.

This invention is illustrated by way of the following Examples, in which all percents are by weight unless otherwise specified.

EXAMPLE 1

A copper-clad laminate for internal layer having internal layer circuits thereon was subjected to roughening treatment with an aqueous solution of ammonium persulfate, followed by the formation of a copper oxide layer using the following treating solution:

| Sodium hydroxide | 0.5% |
|---|---|
| Trisodium phosphate | 1.5% |
| Sodium chlorite | 3% |
| Pure water | 95% |
| Temperature | 75° C. |
| Treating time | 2 minutes |

The thus treated laminate was dipped in the following aqueous aldehyde solution:

| 37% CH$_2$O | 0.6 mole/l |
|---|---|
| Pure water | making the total volume 1 liter |
| Temperature | 60° C. |

The copper oxide layer surface was contacted with a metallic copper plate for 3 seconds in the aqueous aldehyde solution to apply a proper potential. The metallic copper plate had been degreased and polished to remove rust previously. The laminate was continued to be placed in the aqueous aldehyde solution for 120 seconds. The potential of the treated surface was −900 mV in terms of Ag-AgCl electrode.

Then, both sides of the resulting copper-clad laminate were sandwiched by a pair of epoxy resin prepregs, followed by sandwiching with a pair of copper foils and, pressed with heating (pressure 60 kg/cm$^2$, temperature 170° C., time 120 minutes) to produce a multi-layer copper-clad laminate having internal layer circuits therein.

The obtained multi-layer copper-clad laminate was subjected to the following tests:
(i) Internal layer copper foil peeling test
JIS-C 6481
(ii) Resistance to hydrochloric acid
A sample of 130 mm × 30 mm was cut out and the surface copper foils were removed, followed by drilling of 36 holes, each hole having a diameter of 1 mm. Then, the sample was dipped in 19% HCl and state of the laminate was observed after predetermined time (minutes). The mark o means "no change". The mark x means "not usable practically".
(iii) Resistance to electroless copper plating solution
A sample of 130 mm × 30 mm was cut out and the surface copper foils were removed, followed by drilling of 36 holes, each hole having a diameter of 1 mm. Then, the sample was dipped in the following electroless copper plating solution and penetration of the electroless copper plating solution into internal layers was observed after predetermined time (hours). The mark o means "no change". The mark x means "penetrated".

| CuSO$_4$.5H$_2$O | 10 g/l |
|---|---|
| EDTA/2Na | 30 g/l |
| 37% CH$_2$O | 5 ml/l |
| pH | 12.5 (adjusted with NaOH) |
| Pure water | making the total volume 1 liter |

The results are shown in Table 1.

COMPARATIVE EXAMPLE 1

The process of Example 1 was repeated except for not applying a potential by contacting with the metallic copper plate and making the dipping time in the aqueous aldehyde solution 60 minutes. The potential of the copper oxide layer after 60 minutes dipping was −130 mV in terms of Ag-AgCl electrode.

The resulting laminate was tested in the same manner as described in Example 1. The results are shown in Table 1.

TABLE 1

| | Example No. | |
|---|---|---|
| | Example 1 | Comparative Example 1 |
| Internal layer peeling test (kgf/cm) | 1.2 | 1.1 |

TABLE 1-continued

|  |  | Example No. | |
|---|---|---|---|
|  |  | Example 1 | Comparative Example 1 |
| Resistance to HCl (min) | 20 | o | x |
|  | 30 | o | x |
|  | 40 | o | x |
|  | 50 | o | x |
|  | 60 | o | x |
|  | 90 | o | x |
| Resistance to electroless copper plating solution (hrs) | 1 | o | x |
|  | 3 | o | x |
|  | 5 | o | x |
|  | 10 | o | x |
|  | 15 | o | x |
|  | 20 | o | x |

EXAMPLE 2

A printed wiring board for internal layer having internal layer circuits thereon was subjected to roughening treatment with an aqueous solution of ammonium persulfate, followed by the formation of a copper oxide layer using the following treating solution:

| Sodium hydroxide | 15 g/l |
|---|---|
| Trisodium phosphate (NaPO$_4$.12H$_2$O) | 30 g/l |
| Sodium chlorite | 90 g/l |
| Pure water | making the total volume 1 liter |
| Temperature | 85° C. |
| Treating time | 120 seconds |

The resulting internal layer wiring board having a copper oxide layer thereon was washed with water.

A roll for transporting the internal layer wiring board was installed in an aqueous solution of 37% formaldehyde with pH of 12.5 and concentration of 5 ml/l to reduce the copper oxide. The roll was obtained by coating a copper plated cloth (manufactured by Seren K.K.), the surface of which had been plated with gold, on a rubber-made roll. The temperature of the aqueous aldehyde solution for reducing copper oxide was made 50° C. The internal layer wiring board was passed through the roll at a rate of 40 cm/min and contacted with the aqueous aldehyde solution for 5 minutes. After washing with water, the thus treated wiring board was dried at 80° C. for 30 minutes. Both sides of the wiring board was sandwiched with a pair of epoxy resin prepreg, followed by sandwiching with a pair of copper foils and, pressed with heating (pressure 60 kg/cm$^2$, temperature 170° C, time 120 minutes) to prepare a multi-layer copper-clad laminate having internal layer circuits therein.

The obtained multi-layer copper-clad laminate was subjected to the same test as in Example 1. The results are shown in Table 2.

COMPARATIVE EXAMPLE 2

The process of Example 2 was repeated except for not reducing the copper oxide layer in the aqueous aldehyde solution nor contacted with the metal coated roller.

The obtained multi-layer copper-clad laminate was subjected to the same test as in Example 1. The results are shown in Table 2.

TABLE 2

|  |  | Example No. | |
|---|---|---|---|
|  |  | Example 2 | Comparative Example 2 |
| Internal layer peeling test (kgf/cm) |  | 1.2 | 1.1 |
| Resistance to HCl (min) | 20 | o | x |
|  | 30 | o | x |
|  | 40 | o | x |
|  | 50 | o | x |
|  | 60 | o | x |
|  | 90 | o | x |
| Resistance to electroless copper plating solution (hrs) | 1 | o | x |
|  | 3 | o | x |
|  | 5 | o | x |
|  | 10 | o | x |
|  | 15 | o | x |
|  | 20 | o | x |

EXAMPLE 3

A printed wiring board for internal layer having internal layer circuits thereon was subjected to roughening treatment with an aqueous solution of ammonium persulfate, followed by the formation of a copper oxide layer using the following treatment solution:

| Sodium hydroxide | 15 g/l |
|---|---|
| Trisodium phosphate (Na$_3$PO$_4$.12H$_2$O) | 30 g/l |
| Sodium chlorite | 90 g/l |
| Pure water | making the total volume 1 liter |
| Temperature | 85° C. |
| Treating time | 90 seconds |

The resulting internal layer wiring board having a copper oxide layer thereon was washed with water, followed by the treatment with the following treating solution:

| Sodium borohydride | 1 g/l |
|---|---|
| Pure water | making the total volume 1 liter |
| pH | 12.5 |
| Temperature | 40° C. |
| Treating time | 40 seconds |
| Potential of copper surface | −800 mV |

The thus treated wiring board was treated with the following aldehyde solution:

| 36% CH$_2$O | 4 ml/l |
|---|---|
| Pure water | making the total volume 1 liter |
| pH | 12.5 |
| Temperature | 50° C. |
| Treating time | 5 minutes |

The thus treated wiring board was washed with water and dried at 80° C. for 30 minutes. Both sides of the wiring board was sandwiched with a pair of epoxymodified polyimide resin prepregs (I-67, a trade name, mfd. by Hitachi Chemical Co., Ltd.), followed by sandwiching with a pair of copper foils of 35 μm thick and pressed with heating (pressure 50 kg/cm$^2$, temperature 170° C., time 90 minutes) to prepare a sample laminate.

COMPARATIVE EXAMPLE 3

The process of Example 3 was repeated except for not subjected to the treatment with the aqueous formaldehyde solution and changing the treating time with the aqueous solution of sodium borohydride to 10 minutes in place of 40 seconds.

COMPARATIVE EXAMPLE 4

The process of Example 3 was repeated except for not subjected to the treatment with the aqueous solution of sodium borohydride.

The sample laminates obtained in Example 3 and Comparative Examples 3 and 4 were tested in the same manner as described in Example 1. The results are shown in Table 3.

TABLE 3

| Example No. | Example 3 | Comparative Example 3 | Comparative Example 4 |
|---|---|---|---|
| Internal layer peeling test (kg/cm) | 0.90 | 0.60 | 1.0 |
| Surface appearance | Uniform | Uneven | Uniform |
| Resistance to HCl (20-90 mins.) | No change | No change | Penetrated in the whole cases |
| Resistance to electroless copper plating solution (1-20 hrs.) | No change | No change | No change until 5 hrs. Over 10 hrs., penetrated considerably. |

As explained above, according to this invention, adhesion between a resin material such as a prepreg and copper of a conductor circuit, and the like can be improved. Further, the resulting multi-layer printed wiring boards are excellent in resistance to hydrochloric acid and resistance to an electroless copper plating solution.

What is claimed is:

1. A process for treating a copper surface which comprises
    forming a copper oxide layer on a copper surface by treating with an aqueous solution containing an oxidizing agent, and
    treating the copper oxide layer with an aqueous aldehyde solution having a pH of 9.0 or higher to reduce the copper oxide,
    said treatment of the copper oxide layer being carried out
    (a) while applying a potential of $-1000$ mV to $-400$ mV in terms of Ag-AgCl electrode to the copper oxide layer, or
    (b) after contacting the copper oxide layer with a contacting piece made of copper or a metal nobler than copper, or
    (c) after contacting the copper oxide layer with an aqueous solution containing an alkali borohydride so as to make the potential of copper in the range of $-1000$ mV to $-400$ mV in terms of Ag-AgCl electrode.

2. A process according to claim 1, wherein the treatment of the copper oxide layer is carried out while applying a potential of $-1000$ mV to $-400$ mV in terms of Ag-AgCl electrode to the copper oxide layer.

3. A process according to claim 2, wherein the potential is applied by contacting with copper or a metal nobler than copper.

4. A process according to claim 1, wherein the treatment of the copper oxide layer is carried out after contacting the copper oxide layer with a contacting piece made of copper or a metal nobler than copper.

5. A process according to claim 4, wherein the contacting piece is made in the form of roll covered with a copper layer or a layer of a metal nobler than copper.

6. A process according to claim 1, wherein the treatment of the copper oxide layer is carried out after contacting the copper oxide layer with an aqueous solution containing an alkali borohydride so as to make the potential of copper in the range of $-1000$ mV to $-400$ mV in terms of Ag-AgCl electrode.

7. A process according to claim 6, wherein the alkali borohydride is sodium borohydride.

8. A copper-clad laminate obtained by
    subjecting one or both surfaces of copper foil to the surface treatment process of claim 1,
    laminating one or more of the surface treated copper foils and one or more sheets of glass cloth or paper impregnated with an epoxy resin, a phenol resin or a polyimide resin or one or more sheets of an epoxy resin, a phenol resin or a polyimide resin mixed with glass fibers, or laminating one or more of the thus surface treated copper foils coated with an epoxy resin, and
    subjecting the resulting multiple layers to heating and pressing treatment to form a laminated unit having copper layers on the outermost surfaces.

9. A copper-clad flexible film obtained by
    subjecting one or both surfaces of copper foil to the surface treatment process of claim 1, and
    bonding a flexible resin film to the resulting copper foil using an adhesive of epoxy resin or acrylic resin so as to have copper layers on the outermost surfaces.

10. A copper-clad flexible film according to claim 9, wherein the flexible resin film is made from polyimide, polyester, polytetrafluoroethylene, polysulfone, or polyether ether ketone.

11. A multi-layer wiring board obtained by
    laminating one or more copper foils and one or more sheets of glass cloth or paper impregnated with an epoxy resin, a phenol resin or a polyimide resin or one or more sheets of an epoxy resin, a phenol resin or a polyimide resin mixed with glass fibers, or laminating one or more copper foils coated with an epoxy resin, a phenol resin or a polyimide resin,
    subjecting the resulting multiple layers to heating and pressing treatment to form a copper-clad laminate,
    removing unnecessary portions from the copper foil of the laminate by etching to form a circuit pattern for an internal layer,
    subjecting the copper foil thus treated to the surface treatment process of claim 1,
    laminating on the resulting copper surface an epoxy resin, a phenol resin or a polyimide resin, or a glass cloth or paper impregnated with an epoxy resin, a phenol resin or a polyimide resin, or laminating a sheet of an epoxy resin, a phenol resin or a polyimide resin mixed with glass fibers, with repetition of laminating to form multiple layers and a copper foil as an outermost layer,
    subjecting the multiple layers and copper foil to heating and pressing treatment to form a laminated unit having copper layers on the outermost surfaces,
    drilling through-holes in the laminated unit,
    metallizing inner walls of the through-holes, and removing unnecessary portions from the outermost copper layers by etching to form circuits.

12. A multi-layer wiring board obtained by laminating one or more copper foils and one or more sheets of glass cloth or paper impregnated with an epoxy resin, a phenol resin or a polyimide resin or one or more sheets of an epoxy resin, a phenol resin or a polyimide resin mixed with glass fibers, or laminating one or more copper foils coated with an epoxy resin, a phenol resin or a polyimide resin, subjecting the resulting multiple layers to heating and pressing treatment to form a copper-clad laminate, removing unnecessary portions from the copper foil of the laminate by etching to form a circuit pattern for an inner layer, subjecting the copper foil thus treated to the surface treatment process of claim 1, laminating on the resulting copper surface an epoxy resin, a phenol resin or a polyimide resin, or a glass cloth or paper impregnated with an epoxy resin, a phenol resin or a polyimide resin, or laminating a sheet of an epoxy resin, a phenol resin or a polyimide resin mixed with glass fibers, with repetition of laminating to form multiple layers and a copper foil subjected to the surface treatment process of claim 1 as an outermost layer, subjecting the multiple layers and copper foil to heating and pressing treatment to form a laminated unit having copper layers on the outermost surfaces, drilling through-holes in the laminated unit, metallizing inner walls of the through-holes, and removing unnecessary portions from the outermost copper layers by etching to form circuits.

13. A flexible wiring board obtained by bonding a copper foil to a flexible resin film using an adhesive of epoxy resin or acrylic resin to form a copper-clad flexible film, removing unnecessary portions from the copper foil by etching to form a circuit pattern for an inner layer, subjecting the copper foil thus treated to the surface treatment process of claim 1, and bonding a flexible resin film from which necessary portions for connection are removed to the thus treated copper surface with an adhesive of epoxy resin or acrylic resin.

14. A flexible wiring board according to claim 13, wherein the flexible resin film is made from polyimide, polyester, polytetrafluoroethylene, polysulfone, or polyether ether ketone.

* * * * *